United States Patent
Kwak et al.

(10) Patent No.: US 12,167,649 B2
(45) Date of Patent: Dec. 10, 2024

(54) DISPLAY APPARATUS

(71) Applicant: SAMSUNG DISPLAY CO., LTD., Yongin-si (KR)

(72) Inventors: Minchae Kwak, Yongin-si (KR); Mihae Kim, Yongin-si (KR); Wando Lee, Yongin-si (KR); Seungyeon Cho, Yongin-si (KR); Jaeho Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 520 days.

(21) Appl. No.: 17/513,075

(22) Filed: Oct. 28, 2021

(65) Prior Publication Data

US 2022/0328601 A1 Oct. 13, 2022

(30) Foreign Application Priority Data

Apr. 8, 2021 (KR) .................. 10-2021-0046084

(51) Int. Cl.
*H10K 59/131* (2023.01)
(52) U.S. Cl.
CPC ................. *H10K 59/131* (2023.02)
(58) Field of Classification Search
CPC .................................................. H10K 59/131
(Continued)

(56) References Cited

U.S. PATENT DOCUMENTS 9,449,993 B2 9/2016 Kim et al.
10,797,089 B2 10/2020 Song et al.
(Continued)

FOREIGN PATENT DOCUMENTS

KR 1020160083605 A 7/2016
KR 1020160095241 A 8/2016
(Continued)

*Primary Examiner* — Mark Edwards
(74) *Attorney, Agent, or Firm* — CANTOR COLBURN LLP

(57) ABSTRACT

A display apparatus includes: a substrate including a display area and a peripheral area outside the display area; a first data line extending from the display area into the peripheral area; a 1-$1^{st}$ lower load located in the peripheral area and electrically connected to the first data line; a 1-$2^{nd}$ lower load located in the peripheral area and electrically connected to the 1-$1^{st}$ lower load; a 1-$1^{st}$ upper load located in the peripheral area and above the 1-$1^{st}$ lower load, where the 1-$1^{st}$ upper load is insulated from the 1-$1^{st}$ lower load; and a 1-$2^{nd}$ upper load located in the peripheral area and above the 1-$2^{nd}$ lower load, where the 1-$2^{nd}$ upper load is insulated from the 1-$2^{nd}$ lower load and electrically connected to the 1-$1^{st}$ upper load.

21 Claims, 7 Drawing Sheets

(58) Field of Classification Search
USPC ......................................................... 345/204
See application file for complete search history.

(56) References Cited

U.S. PATENT DOCUMENTS

| | | | |
|---|---|---|---|
| 11,024,216 B2 | 6/2021 | Shin et al. | |
| 2018/0204889 A1 | 7/2018 | Yu et al. | |
| 2019/0019789 A1 | 1/2019 | Kim et al. | |
| 2019/0326334 A1* | 10/2019 | Song | H01L 27/1255 |
| 2020/0303489 A1 | 9/2020 | Ka et al. | |
| 2021/0027704 A1* | 1/2021 | Tong | G09G 3/3225 |
| 2021/0036087 A1 | 2/2021 | Kwak et al. | |
| 2023/0136237 A1* | 5/2023 | Wei | G09G 3/3233 |
| | | | 345/204 |

FOREIGN PATENT DOCUMENTS

| | | |
|---|---|---|
| KR | 1020190027978 A | 3/2019 |
| KR | 102174662 B1 | 11/2020 |

\* cited by examiner

DISPLAY APPARATUS

This application claims priority to Korean Patent Application No. 10-2021-0046084, filed on Apr. 8, 2021, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus for which a defect ratio in a manufacturing process may be reduced.

2. Description of the Related Art

A display apparatus typically includes various lines to control whether to perform light emission from display elements arranged in a display area or a level of the light emission. For example, the display apparatus may include a data line to control a degree of light emission of a display apparatus according to an electrical signal received via the data line.

SUMMARY

However, defects may occur in a manufacturing process of the display apparatus according to the related art.

One or more embodiments include a display apparatus, a defect ratio of which in a manufacturing process may be reduced. However, these aspects are just examples, and the scope of the present disclosure is not limited thereby.

Additional aspects will be set forth in part in the description which follows and, in part, will be apparent from the description, or may be learned by practice of the presented embodiments of the disclosure.

One or more embodiments include a display apparatus, in a manufacturing process of which a defect ratio may be reduced, includes: a substrate including a display area and a peripheral area outside the display area; a first data line extending from the display area into the peripheral area; a $1\text{-}1^{st}$ lower load located in the peripheral area and electrically connected to the first data line; a $1\text{-}2^{nd}$ lower load located in the peripheral area and electrically connected to the $1\text{-}1^{st}$ lower load; a $1\text{-}1^{st}$ upper load located in the peripheral area and above the $1\text{-}1^{st}$ lower load, where the $1\text{-}1^{st}$ upper load is insulated from the $1\text{-}1^{st}$ lower load; and a $1\text{-}2^{nd}$ upper load located in the peripheral area and above the $1\text{-}2^{nd}$ lower load, where the $1\text{-}2^{nd}$ upper load is insulated from the $1\text{-}2^{nd}$ lower load, and electrically connected to the $1\text{-}1^{st}$ upper load.

When viewed from a direction perpendicular to the substrate, the $1\text{-}1^{st}$ upper load may overlap the $1\text{-}1^{st}$ lower load, and the $1\text{-}2^{nd}$ upper load overlaps the $1\text{-}2^{nd}$ lower load.

The display apparatus may further include: a second data line extending from the display area into the peripheral area; a $2\text{-}1^{st}$ lower load located in the peripheral area and electrically connected to the second data line; a $2\text{-}2^{nd}$ lower load located in the peripheral area and electrically connected to the $2\text{-}1^{st}$ lower load; a $2\text{-}1^{st}$ upper load located in the peripheral area and above the $2\text{-}1^{st}$ lower load, where the $2\text{-}1^{st}$ upper load is insulated from the $2\text{-}1^{st}$ lower load; and a $2\text{-}2^{nd}$ upper load located in the peripheral area and above the $2\text{-}2^{nd}$ lower load, where the $2\text{-}2^{nd}$ upper load is insulated from the $2\text{-}2^{nd}$ lower load, and electrically connected to the $2\text{-}1^{st}$ upper load.

A first capacitance between lower loads including the $1\text{-}1^{st}$ lower load and the $1\text{-}2^{nd}$ lower load and upper loads including the $1\text{-}1^{st}$ upper load and the $1\text{-}2^{nd}$ upper load may be different from a second capacitance between lower loads including the $2\text{-}1^{st}$ lower load and the $2\text{-}2^{nd}$ lower loads and upper loads including the $2\text{-}1^{st}$ upper load and the $2\text{-}2^{nd}$ upper load.

A distance from the first data line to a center of the display area may be greater than a distance from the second data line to the center of the display area, and a first capacitance between lower loads including the $1\text{-}1^{st}$ lower load and the $1\text{-}2^{nd}$ lower load and upper loads including the $1\text{-}1^{st}$ upper load and the $1\text{-}2^{nd}$ upper load may be greater than a second capacitance between lower loads including the $2\text{-}1^{st}$ lower load and the $2\text{-}2^{nd}$ lower loads and upper loads including the $2\text{-}1^{st}$ upper load and the $2\text{-}2^{nd}$ upper load.

The display apparatus may further include a thin-film transistor located in the display area and including a gate electrode, wherein the $1\text{-}1^{st}$ lower load, the $1\text{-}2^{nd}$ lower load, and the gate electrode have the same layer structure as each other.

The $1\text{-}1^{st}$ lower load, the $1\text{-}2^{nd}$ lower load, and the gate electrode may be on the same layer as each other.

The display apparatus may further include a capacitor electrode located in the display area and above the gate electrode, wherein the $1\text{-}1^{st}$ upper load, the $1\text{-}2^{nd}$ upper load, and the capacitor electrode have the same layer structure as each other.

The $1\text{-}1^{st}$ upper load, the $1\text{-}2^{nd}$ upper load, and the capacitor electrode may be on the same layer as each other.

The display apparatus may further include a lower load connection layer and an upper load connection layer which are disposed on a first insulating layer covering the $1\text{-}1^{st}$ upper load and the $1\text{-}2^{nd}$ upper load, and the lower load connection layer is connected to the $1\text{-}1^{st}$ lower load and the $1\text{-}2^{nd}$ lower load via first contact holes, and the upper load connection layer is connected to the $1\text{-}1^{st}$ upper load and the $1\text{-}2^{nd}$ upper load via second contact holes.

The display apparatus may further include: a first scan connection line which is disposed on a second insulating layer covering the lower load connection layer and the upper load connection layer, and extends from a scan driving circuit located in the peripheral area to cross over the lower load connection layer and the upper load connection layer; a second scan connection line which is disposed on the first insulating layer, and has a first end electrically connected to the first scan connection line through a third contact hole defined in the second insulating layer, and a scan line disposed on the same layer as the gate electrode and electrically connected to a second end of the second scan connection line opposite the first end.

The first data line may be disposed on the second insulating layer.

The display apparatus may further include a test line disposed on the second insulating layer in the peripheral area and including a portion parallel to a portion of the first scan connection line.

The test line and the first data line may be integrated formed as a single body.

The test line may be electrically connected to a lighting test circuit located in the peripheral area.

The display apparatus may further include a power line disposed on the second insulating layer, extending from the display area into the peripheral area, and electrically connected to the 1-1$^{st}$ upper load.

The power line may be parallel to the first data line in the display area.

The display apparatus may further include: a first emission connection line which is disposed on a second insulating layer covering the lower load connection layer and the upper load connection layer, and extends from the scan driving circuit located in the peripheral area to cross over the lower load connection layer and the upper load connection layer; a second emission connection line which is disposed on the first insulating layer, and has a first end electrically connected to the first emission connection line through a fourth contact hole defined in the second insulating layer; and an emission control line extending into the display area and electrically connected to a second end of the second emission connection line opposite the first end.

The emission control line, the 1-1$^{st}$ upper load, and the 1-2$^{nd}$ upper load may be on the same layer as each other.

When viewed from a direction perpendicular to the substrate, a central axis passing through a center of the 1-1$^{st}$ lower load and a central axis passing through a center of the 1-2$^{nd}$ lower load may be located on the same imaginary straight line, and a direction in which the first data line extends in the display area may be parallel to the imaginary straight line.

When viewed from a direction perpendicular to the substrate, the display area may have no pointed portions.

When viewed from a direction perpendicular to the substrate, the display area may have a circular or elliptical shape.

Other aspects, features, and advantages other than those described above will become apparent from the accompanying drawings, the appended claims, and the detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
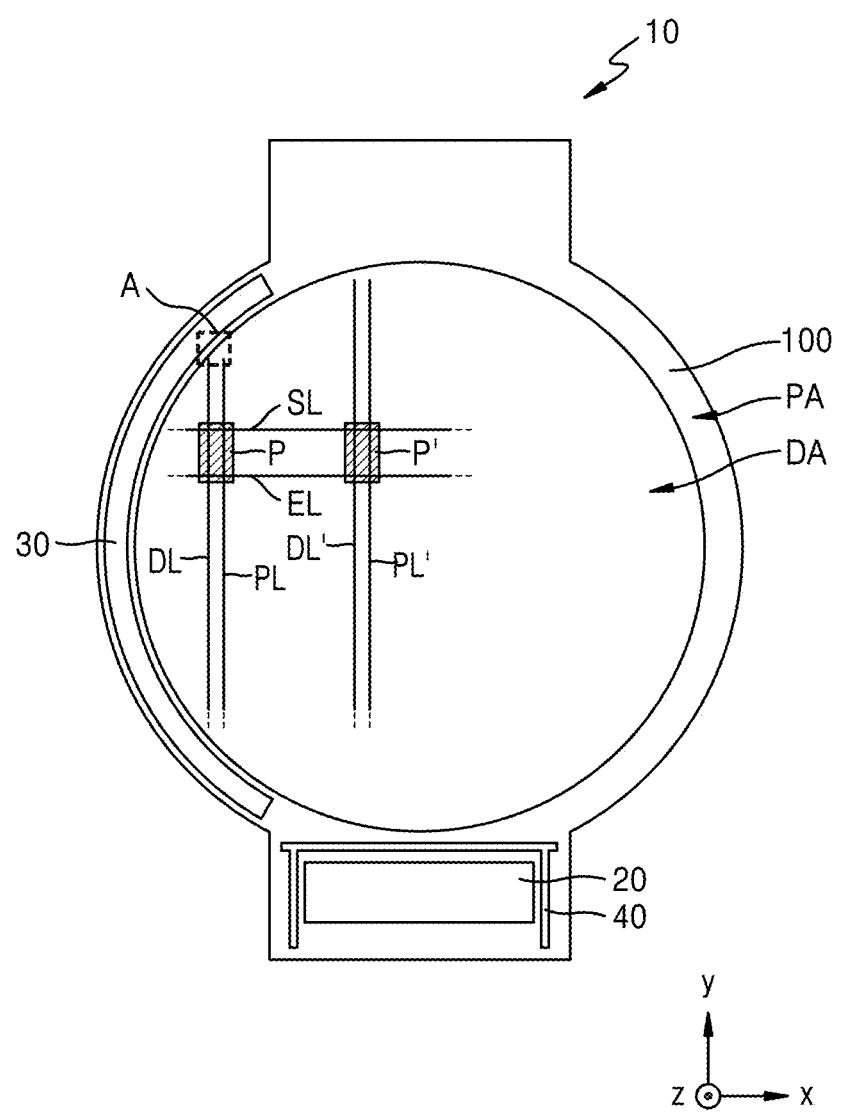
FIG. 1 is a schematic plan view of a portion of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described in detail with reference to the accompanying drawings, and in the description with reference to the drawings, like reference numerals refer to like elements and redundant descriptions thereof will be omitted.

In the embodiments below, it will be understood when various elements such as a layer, a film, an area, or a plate is referred to as being "on" or "above" another element, it can be directly on or above the other element, or an intervening element may also be present. Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the embodiments below, an x-axis, a y-axis, and a z-axis are not limited to three axes on a rectangular coordinates system but may be construed as including these axes. For example, an—x axis, a y-axis, and a z-axis may be at right angles or may also indicate different directions from one another, which are not at right angles. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

FIG. 1 is a schematic plan view of a portion of a display apparatus 10 according to an embodiment. The display apparatus 10 according to the present embodiment includes a substrate 100. The substrate 100 may include a display area DA and a peripheral area PA outside the display area DA. The display area DA is an area in which an image is displayed, and a plurality of pixels may be arranged in the display area DA. When viewed from a direction perpendicular to the substrate 100 (z-axis direction, that is a plan view), the display area DA may have no pointed portions and have a circular or elliptical shape overall as illustrated in FIG. 1. Referring to FIG. 1, as the display area DA has a circular shape, the substrate 100 also has an approximately circular shape when viewed from a direction perpendicular to the substrate 100 (z-axis direction, that is a plan view). The substrate 100 may have, as illustrated in FIG. 1, a circular portion and a quadrangular portion on one or opposite sides of the circular portion. The peripheral area PA may be located outside the display area DA. The peripheral area PA may have, for example, a shape surrounding the display area DA.

Various components included in the display apparatus 10 may be arranged on the substrate 100. The substrate 100 may include glass, a metal, or a polymer resin. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate. Various modifications may also be made to the substrate 100; for example, the substrate 100 may have a multi-layer structure including two layers each including the above-described polymer resin and a barrier layer therebetween and including an inorganic material (e.g., silicon oxide, silicon nitride, or silicon oxynitride).

While FIG. 1 shows that the substrate 100 has a flat structure positioned on an x-y plane for convenience, the present disclosure is not limited thereto. In the display apparatus according to the present embodiment, a portion of the substrate 100 may be bent. For example, as illustrated in FIG. 1, when the substrate 100 has a first portion having an overall circular shape and a second portion having a rectangular shape located on one or opposite sides thereof, the second portion may be bent with respect to a bending axis (that is parallel to, for example, an x-axis). Accordingly, when the substrate 100 is bent as described above and viewed from a direction perpendicular to the display area DA (z-axis direction), the area of the peripheral area PA viewed by a user may be reduced.

A plurality of pixels P and P' are arranged in the display area DA. Each of the pixels P and P' refers to a sub-pixel and may include a display element such as an organic light-emitting diode ("OLED"). The pixels P and P' may emit, for example, light of a red color, a green color, a blue color or a white color.

The pixels P and P' may be electrically connected to outer circuits arranged in the peripheral area PA. A data driving circuit 20, a scan driving circuit 30, and a power supply line 40, or the like, may be arranged in the peripheral area PA.

The data driving circuit 20 may be configured to receive an electrical signal from a printed circuit board (not shown) and provide a data signal to the pixels P and P' via data lines DL and DL'. The data driving circuit 20 may be directly disposed on the substrate 100, may be an integrated circuit ("IC") chip adhered to the substrate 100 by using an electrical adhesive, or may be attached to the substrate 100 in the form of a chip on film ("COF"). The scan driving circuit 30 may be configured to provide a scan signal to the plurality of pixels P and P' via a scan line SL. The power supply line 40 may be configured to provide power received from a printed circuit board or the like, to the pixels P and P; via power lines PL and PL'. To this end, the data lines DL and DL' located in the display area DA may be electrically connected to the data driving circuit 20 located in the peripheral area PA, and the scan line SL located in the display area DA may be electrically connected to the scan driving circuit 30 located in the peripheral area PA. The power lines PL and PL' located in the display area DA may be electrically connected to the power supply line 40 located in the peripheral area PA. The printed circuit board may be electrically connected to pads (not shown) located on the edges of the substrate 100. The data driving circuit 20, the scan driving circuit 30, and the power supply line 40 may be electrically connected to the pads.

FIG. 1 illustrates that the data driving circuit 20 is configured to provide a data signal to the pixel P through the data line DL, provide a data signal to the pixel P' through the data line DL', provide power to the pixel P through the power line PL, and provide power to the pixel P' through the power line PL'.

Furthermore, an emission control driving circuit (not shown) may be located in the peripheral area PA of the substrate 100, and an emission control line EL electrically connected to the emission control driving circuit may be configured to provide an emission control signal to the pixels P and P' in the display area DA. The emission control driving circuit may be integrally formed as a single body with the scan driving circuit 30 for convenience, or the scan driving circuit 30 may be distributed in a plurality of regions, and the emission control driving circuit may be distributed between the regions. In addition, an electrode power line (not shown) may be located in the peripheral area PA of the substrate 100 to be electrically connected to an opposite electrode in the display area DA to supply electrode power to the opposite electrode. In addition, an initialization voltage line (not shown, see VL in FIG. 2) may be located in the peripheral area PA of the substrate 100 and electrically connected to a first initialization voltage line VL1 (see FIG. 2, for example) and a second initialization voltage line VL2 (see FIG. 2, for example) in the display area DA to supply an initialization voltage Vint (see FIG. 2, for example).

Hereinafter, a case in which the display apparatus 10 according to the present embodiment includes an organic light-emitting diode as a display element in the display area DA will be described. However, the display apparatus according to the present disclosure is not limited thereto. For example, the display apparatus of the present disclosure may include an inorganic light-emitting element as a display element. Alternatively, the display apparatus according to the present disclosure may include a quantum dot light-emitting display that includes an organic light-emitting diode or an inorganic light-emitting diode and changes at least some wavelengths of light emitted from the organic or inorganic light-emitting diode to other wavelengths through quantum dots.

Figure 2:
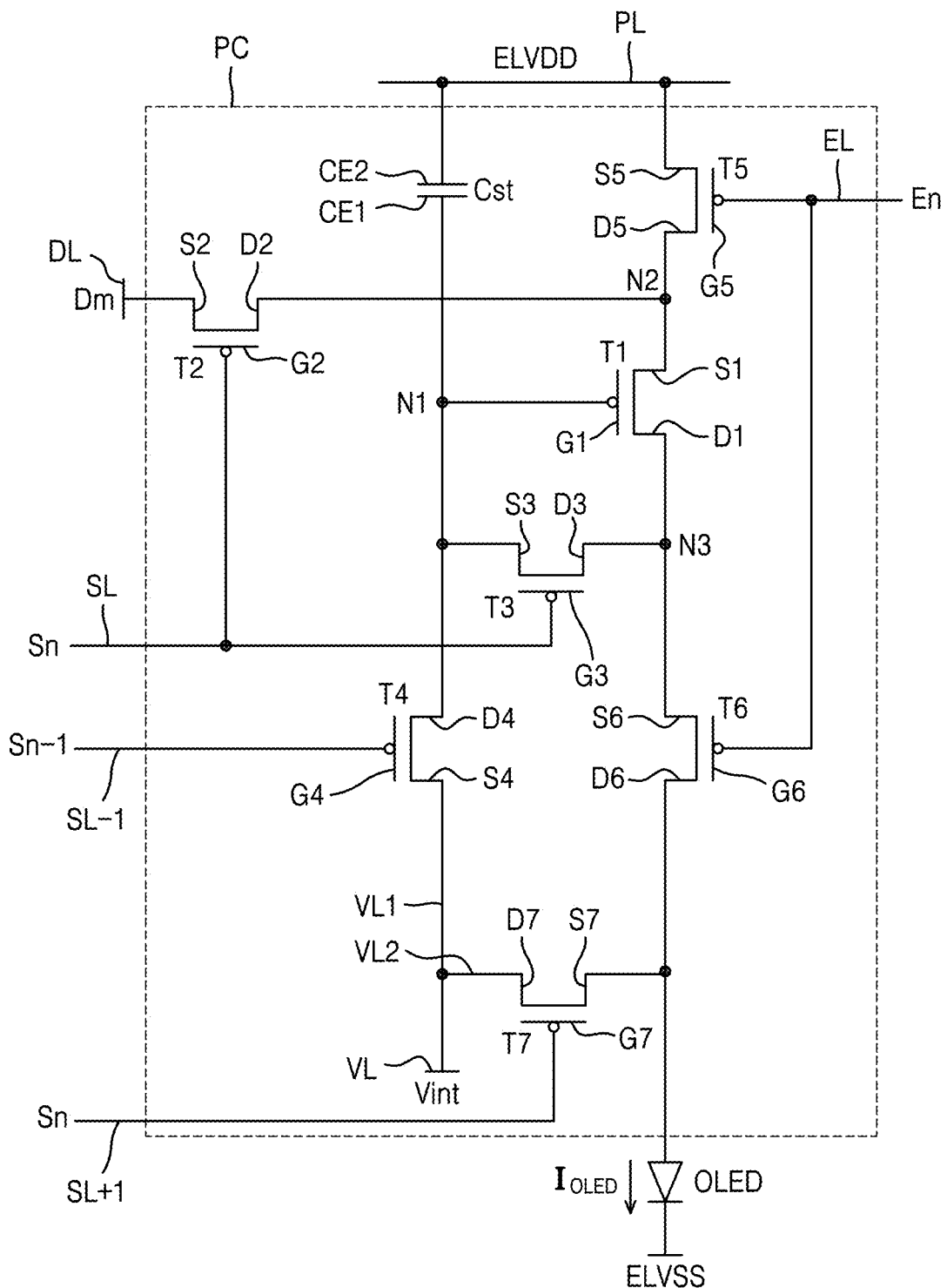
FIG. 2 is an equivalent circuit diagram of a pixel included in the display apparatus of FIG. 1.

FIG. 2 is an equivalent circuit diagram of the pixel P included in the display apparatus 10 of FIG. 1.

A pixel circuit PC located in one pixel P may include a plurality of thin-film transistors T1 through T7 and a storage capacitor Cst. The thin-film transistors T1 through T7 and the storage capacitor Cst may be connected to signal lines SL, SL−1, SL+1, EL, and DL, the first initialization voltage line VL, the second initialization voltage line VL2, and the power line PL.

The signal lines SL, SL−1, SL+1, EL, and DL may include the scan line SL configured to transfer a scan signal Sn, a previous scan line SL−1 configured to transfer a previous scan signal Sn−1 to a first initialization thin-film transistor T4, a subsequent scan line SL+1 configured to transfer the scan signal Sn to a second initialization thin-film transistor T7, the emission control line EL configured to transfer an emission control signal En to an operation control thin-film transistor T5 and an emission control thin-film transistor T6, and a data line DL that crosses the scan line SL and is configured to transfer a data signal Dm. The power line PL may be configured to provide a driving voltage ELVDD to the driving thin-film transistor T1, and the first initialization voltage line VL1 may be configured to provide the initialization voltage Vint to the first initialization thin-film transistor T4, and the second initialization voltage line VL2 may be configured to provide the initialization voltage Vint to the second initialization thin-film transistor T7. The first initialization voltage line VL1 and the second initialization voltage line VL2 may be connected to the initialization voltage line VL.

A driving gate electrode G1, which is a first gate electrode of the driving thin-film transistor T1 which is a first transistor, is connected to a lower electrode CE1 of the storage capacitor Cst, and a driving source region S1 of the driving thin-film transistor T1 is connected to the power line PL via the operation control thin-film transistor T5, and a driving drain region D1 of the driving thin-film transistor T1 is electrically connected to a pixel electrode of an organic light-emitting diode OLED via the emission control thin-film transistor T6. That is, in response to a voltage applied to a first node N1, that is, the voltage applied to the driving gate electrode G1, the driving thin-film transistor T1 may control an amount of current flowing through the organic light-emitting diode OLED, from a second node N2 connected to the power line PL. Accordingly, the driving thin-film transistor T1 receives the data signal Dm according to a switching operation of a switching thin-film transistor T2 and supplies a driving current $I_{OLED}$ to the organic light-emitting diode OLED. The operation control thin-film transistor T5 may be between the second node N2 and the power line PL.

For reference, as described above, the driving gate electrode G1, which is the first gate electrode of the driving thin-film transistor T1, which is the first transistor, is connected to the lower electrode CE1 of the storage capacitor Cst, and thus, when necessary, the driving gate electrode G1 and the lower electrode CE1 of the storage capacitor Cst may be integrally formed as a single body. The electrodes connected to each other as above may be integrally formed as a single body as needed. This also applies to embodiments to be described later and modified examples thereof.

A switching gate electrode G2, which is a second gate electrode of the switching thin-film transistor T2 which is a second transistor, is connected to the scan line SL, and a switching source region S2 of the switching thin-film transistor T2 is connected to the data line DL, and a switching drain region D2 of the switching thin-film transistor T2 is connected to the second node N2 to be connected to the driving source region S1 of the driving thin-film transistor T1 and also to the power line PL via the operation control thin-film transistor T5. The switching thin-film transistor T2 may be turned on according to the scan signal Sn received via the scan line SL to perform a switching operation of transferring the data signal Dm transferred to the data line DL, to the driving source region S1 of the driving thin-film transistor T1.

A compensation thin-film transistor T3, which is a third transistor, may be connected between a third node N3 and the first node N1 between the driving thin-film transistor T1 and the organic light-emitting diode OLED to diode-connect the driving thin-film transistor T1 in accordance with a voltage applied to a compensation gate electrode G3 which is a third gate electrode. That is, the compensation gate electrode G3 of the compensation thin-film transistor T3 is connected to the scan line SL, and a compensation drain region D3 of the compensation thin-film transistor T3 is connected to the driving drain region D1 of the driving thin-film transistor T1 and also to the pixel electrode of the organic light-emitting diode OLED via the emission control thin-film transistor T6, and a compensation source region S3 of the compensation thin-film transistor T3 is connected to the lower electrode CE1 of the storage capacitor Cst, a first initialization drain region D4 of the first initialization thin-film transistor T4, and the driving gate electrode G1 of the driving thin-film transistor T1.

The compensation thin-film transistor T3 is turned on according to the scan signal Sn received via the scan line SL to electrically connect the driving gate electrode G1 and the driving drain region D1 of the driving thin-film transistor T1 to each other to thereby diode-connect the driving thin-film transistor T1.

The first initialization thin-film transistor T4, which is a fourth transistor, is connected between the first node N1 and the first initialization voltage line VL1 to initialize a voltage of the driving gate electrode G1 in accordance with a voltage applied to a first initialization gate electrode G4, which is a fourth gate electrode. That is, the first initialization gate electrode G4 of the first initialization thin-film transistor T4 is connected to the previous scan line SL−1, and a first initialization source region S4 of the first initialization thin-film transistor T4 is connected to the first initialization voltage line VL1, and the first initialization drain region D4 of the first initialization thin-film transistor T4 is connected to the lower electrode CE1 of the storage capacitor Cst, the compensation source region S3 of the compensation thin-film transistor T3, and the driving gate electrode G1 of the driving thin-film transistor T1. The first initialization thin-film transistor T4 is turned on according to the previous scan signal Sn−1 received via the previous scan line SL−1 to transfer the initialization voltage Vint to the driving gate electrode G1 of the driving thin-film transistor T1 to perform an initializing operation of initializing a voltage of the driving gate electrode G1 of the driving thin-film transistor T1.

The operation control thin-film transistor T5, which is a fifth transistor, is connected between the second node N2 and the power line PL, and may be turned on according to a voltage applied to an operation control gate electrode G5, which is a fifth gate electrode. That is, the operation control gate electrode G5 of the operation control thin-film transistor T5 is connected to the emission control line EL, and an operation control source region S5 of the operation control thin-film transistor T5 is connected to the power line PL, and an operation control drain region D5 of the operation control thin-film transistor T5 is connected to the driving source region S1 of the driving thin-film transistor T1 and the switching drain region D2 of the switching thin-film transistor T2.

The emission control thin-film transistor T6, which is a sixth transistor, is connected between the third node N3 and the organic light-emitting diode OLED, and may be turned on according to a voltage applied to an emission control gate electrode G6, which is a sixth gate electrode, from the emission control line EL. That is, the emission control gate electrode G6 of the emission control thin-film transistor T6 is connected to the emission control line EL, and an emission control source region S6 of the emission control thin-film transistor T6 is connected to the driving drain region D1 of the driving thin-film transistor T1 and the compensation drain region D3 of the compensation thin-film transistor T3, and an emission control drain region D6 of the emission control thin-film transistor T6 is electrically connected to a second initialization source region S7 of the second initialization thin-film transistor T7 and the pixel electrode of the organic light-emitting diode OLED.

The operation control thin-film transistor T5 and the emission control thin-film transistor T6 are simultaneously turned on according to the emission control signal En received via the emission control line EL such that the driving voltage ELVDD is transferred to the organic light-emitting diode OLED and the driving current $I_{OLED}$ flows through the organic light-emitting diode OLED.

A second initialization gate electrode G7, which is a seventh gate electrode of the second initialization thin-film transistor T7 which is a seventh transistor, is connected to the subsequent scan line SL+1, and the second initialization source region S7 of the second initialization thin-film transistor T7 is connected to the emission control drain region D6 of the emission control thin-film transistor T6 and the pixel electrode of the organic light-emitting diode OLED, and the second initialization drain region D7 of the second initialization thin-film transistor T7 is connected to the second initialization voltage line VL2.

As the scan line SL and the subsequent scan line SL+1 are electrically connected to each other, the same scan signal Sn may be applied to the scan line SL and the subsequent scan line SL+1. Accordingly, the second initialization thin-film transistor T7 may be turned on according to the scan signal Sn received via the subsequent scan line SL+1 to perform an operation of initializing the pixel electrode of the organic light-emitting diode OLED. The second initialization thin-film transistor T7 may be omitted when necessary. For reference, the subsequent scan line SL+1 may be connected to the fourth transistor T4 of a pixel in a next row. That is, the subsequent scan line SL+1 may be connected to the first initialization gate electrode G4 which is the fourth gate electrode of a pixel in a next row. The subsequent scan line SL+1 may operate as the previous scan line SL−1 in a pixel of a next row.

An upper electrode CE2 of the storage capacitor Cst is connected to the power line PL, and an opposite electrode of the organic light-emitting diode OLED may be connected to the electrode power line to have an electrode voltage ELVSS. Accordingly, the organic light-emitting diode OLED may receive the driving current $I_{OLED}$ from the driving thin-film transistor T1 and emit light to display an image.

Figure 3:
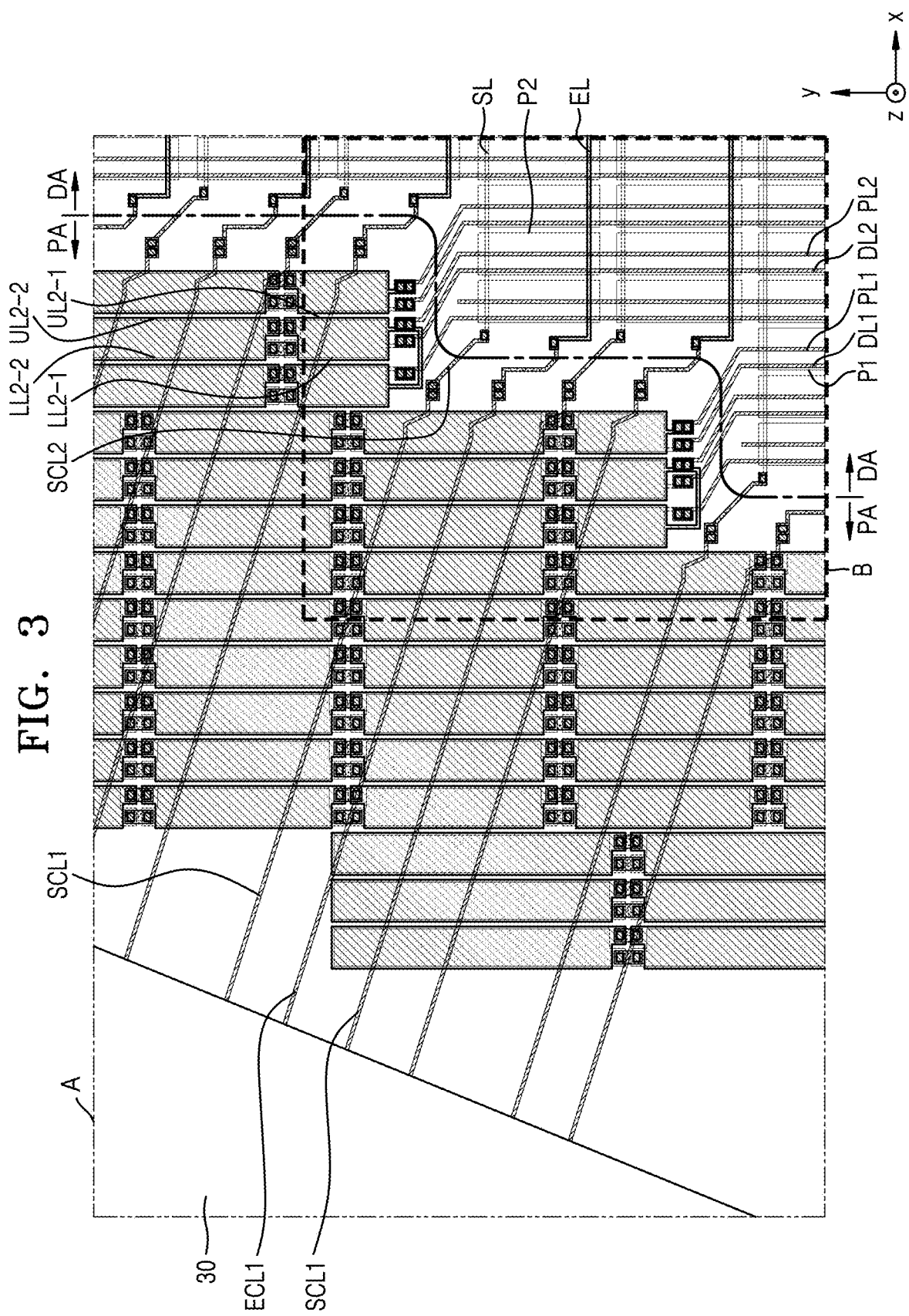
FIG. 3 is a conceptual diagram illustrating an enlarged region A of the display apparatus of FIG. 1.
Figure 4:
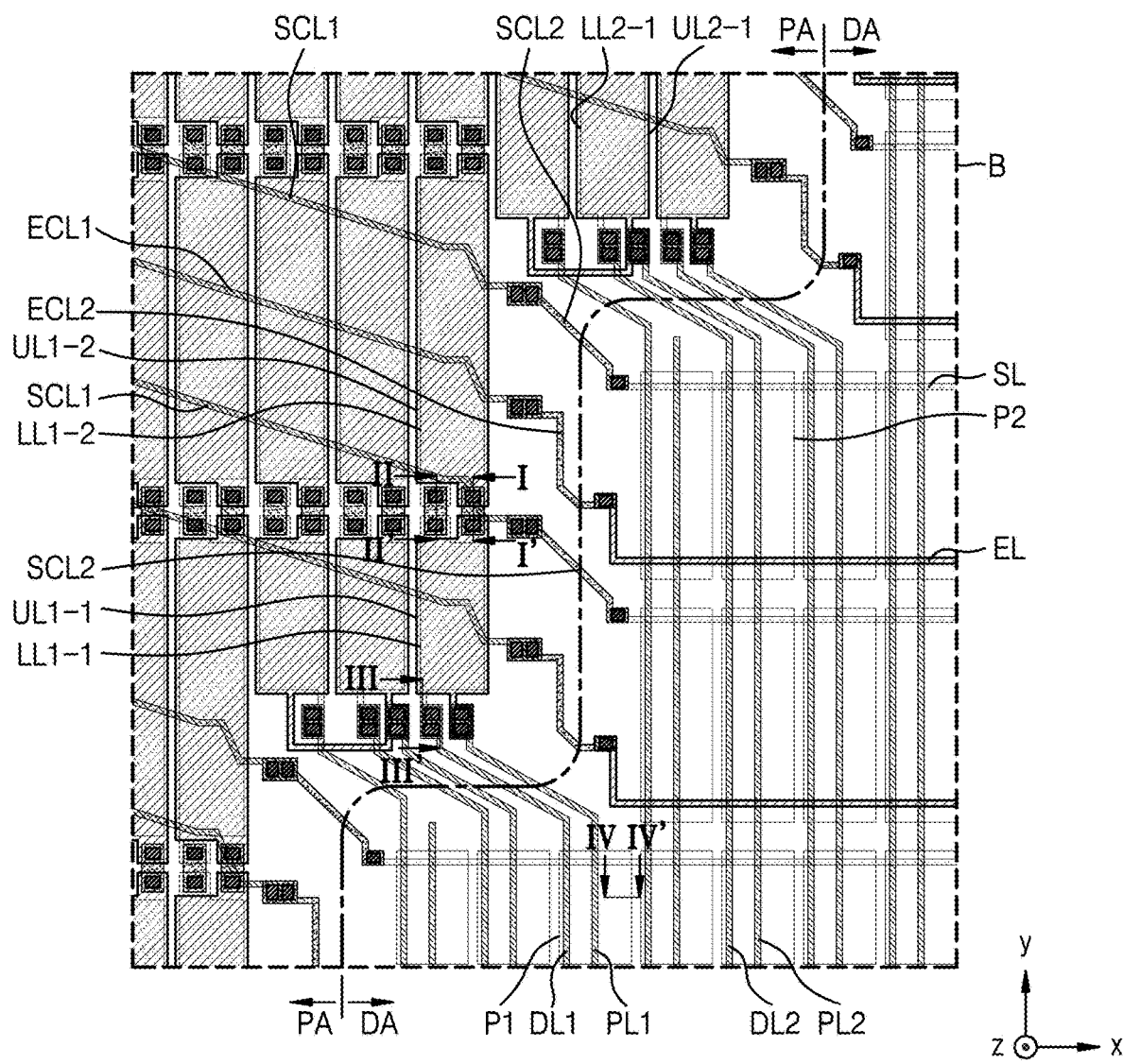
FIG. 4 is a conceptual diagram illustrating an enlarged region B of the display apparatus of FIG. 3.
Figure 5:
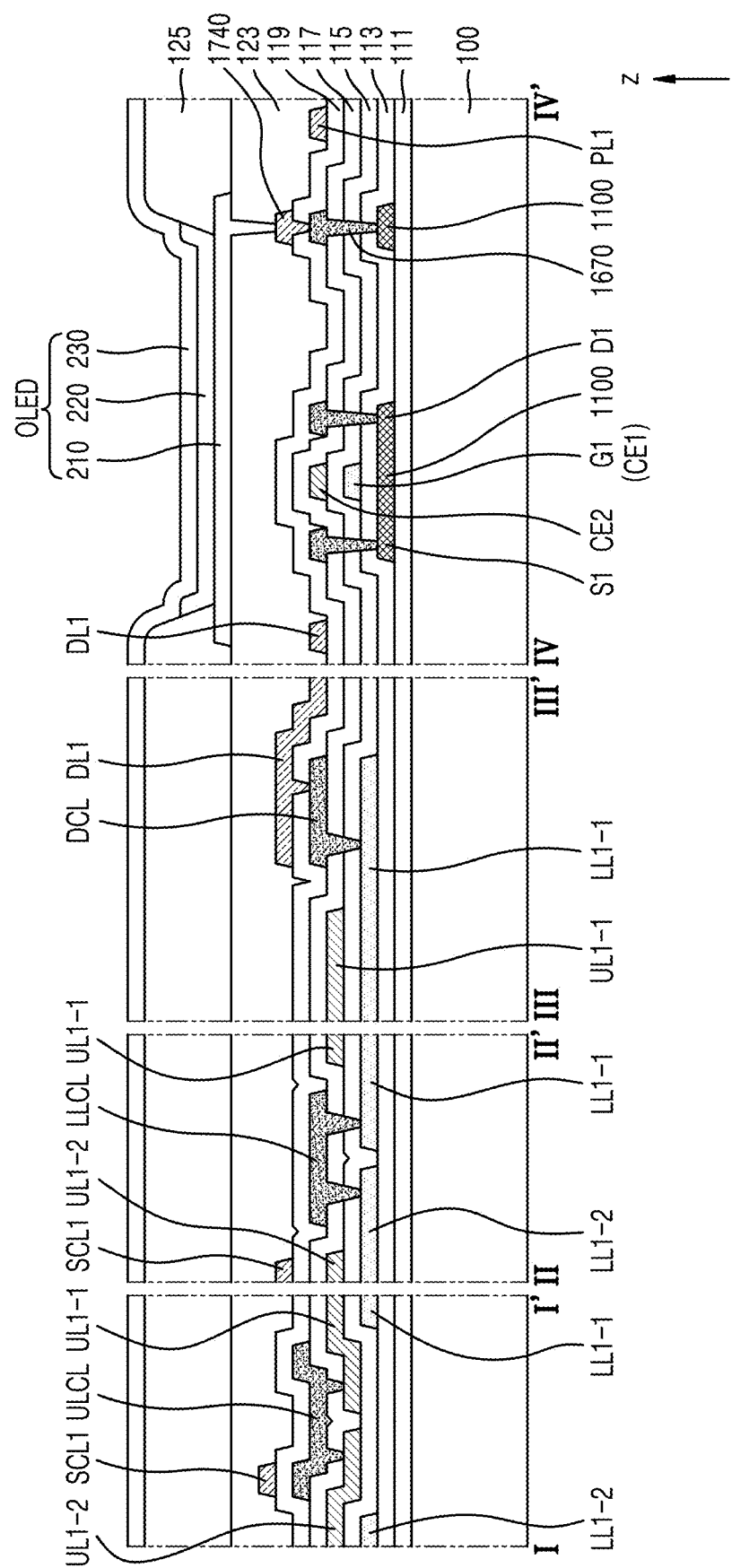
FIG. 5 is a schematic cross-sectional view of portions of the display apparatus of FIG. 4.

FIG. 3 is a conceptual diagram illustrating an enlarged region A of the display apparatus 10 of FIG. 1, FIG. 4 is a conceptual diagram illustrating an enlarged region B of the display apparatus 10 of FIG. 3, and FIG. 5 is a schematic cross-sectional view illustrating cross-sections taken along line I-I', line II-II', line III-III', and line IV-IV' of the display apparatus 10 of FIG. 4, respectively. In FIGS. 3 and 4, an approximate boundary between the display area DA and the peripheral area PA is indicated by a dashed-dotted line. In FIGS. 3 and 4, the approximate boundary between the display area DA and the peripheral area PA is bent a plurality of times, but this is because FIGS. 3 and 4 are enlarged views of the display apparatus according to the present embodiment. The approximate boundary between the display area DA and the peripheral area PA in a non-enlarged view may have overall a circular shape, an elliptical shape, or other non-pointed closed curve shapes as illustrated in FIG. 1.

As illustrated in FIGS. 3 and 4, a first data line DL1 extends from the display area DA into the peripheral area PA. The first data line DL1 extends approximately in the first direction (+y direction) in the display area DA and passes by a plurality of pixels. In FIGS. 3 and 4, the first data line DL1 is illustrated as passing by a first pixel P1. The first data line DL1 is electrically connected to a 1-$1^{st}$ lower load LL1-1 located in the peripheral area PA. In detail, the first data line DL1 is disposed on an insulating layer covering the 1-$1^{st}$ lower load LL1-1 as will be described later, and the first data line DL1 may be connected to the 1-$1^{st}$ lower load LL1-1 via a contact hole.

In the peripheral area PA, in addition to the 1-$1^{st}$ lower load LL1-1, a 1-$2^{nd}$ lower load LL1-2 is also located. The 1-$2^{nd}$ lower load LL1-2 is located in the first direction (+y direction) from the 1-$1^{st}$ lower load LL1-1. That is, when viewed from a direction perpendicular to the substrate 100 (z-axis direction, that is a plan view), a central axis passing through a center of the 1-$1^{st}$ lower load LL1-1 in the first direction and a central axis passing through a center of the 1-$2^{nd}$ lower load LL1-2 in the first direction are located on the same imaginary straight line. This imaginary straight line is parallel to the first direction in which the first data line DL1 extends in the display area DA. The 1-$2^{nd}$ lower load LL1-2 is electrically connected to the 1-$1^{st}$ lower load LL1-1. A structure in which the 1-$1^{st}$ lower load LL1-1 and the 1-$2^{nd}$ lower load LL1-2 are electrically connected to each other will be described later.

As illustrated in FIGS. 3 and 4, a first power line PL1 extends from the display area DA into the peripheral area PA. The first power line PL1 extends approximately in the first direction (+y direction) in the display area DA and passes by a plurality of pixels. In FIGS. 3 and 4, the first power line PL1 is illustrated as passing by the first pixel P1. That is, the first power line PL1 may be substantially parallel to the first data line DL1 in the display area DA.

The first power line PL1 is electrically connected to a 1-$1^{st}$ upper load UL1-1 located in the peripheral area PA. In detail, the first power line PL1 is disposed on an insulating layer covering the 1-$1^{st}$ upper load UL1-1 as will be described later, and the first power line PL1 may be connected to the 1-$1^{st}$ upper load UL1-1 via a contact hole.

In the peripheral area PA, in addition to the 1-$1^{st}$ upper load UL1-1, a 1-$2^{nd}$ upper load UL1-2 is also located. The 1-$2^{nd}$ upper load UL1-2 is located in the first direction (+y direction) from the 1-$1^{st}$ upper load UL1-1. That is, when viewed from a direction perpendicular to the substrate 100 (z-axis direction, that is a plan view), a central axis passing through a center of the 1-$1^{st}$ upper load UL1-1 in the first direction and a central axis passing through a center of the 1-$2^{nd}$ upper load UL1-2 in the first direction are located on the same imaginary straight line. This imaginary straight line is parallel to the first direction in which the first power line PL1 extends in the display area DA. The 1-$2^{nd}$ upper load UL1-2 is electrically connected to the 1-$1^{st}$ upper load UL1-1. A structure in which the 1-$1^{st}$ upper load UL1-1 and the 1-$2^{nd}$ upper load UL1-2 are electrically connected to each other will be described later.

The 1-1st upper load UL1-1 is disposed above the 1-1st lower load LL1-1 and is electrically insulated from the 1-$1^{st}$ lower load LL1-1. The 1-$2^{nd}$ upper load UL1-2 electrically connected to the 1-$1^{st}$ upper load UL1-1 is also disposed above the 1-$2^{nd}$ lower load LL1-2 and is electrically insulated from the 1-$2^{nd}$ lower load LL1-2.

As illustrated in FIG. 1, when the display area DA of the display apparatus 10 has a circular or elliptical shape, the data lines DL and DL' extending in the first direction (+y direction) in the display area DA vary in length depending on their positions (i.e., position in x direction) in the display area DA. For example, in FIG. 1, the data line DL' passing through near a center of the display area DA and extending in the first direction (+y direction) is longer than the data line DL that passes through a location far from the center of the display area DA and extends in the first direction (+y direction). As each of the data lines DL and DL' overlaps with other lines disposed on different layers, parasitic capacitance between each of the data lines DL and DL' and the other lines on such different layers exists. Accordingly, when a length of one data line DL is different from a length of another data line DL', the number of lines that are in a different layer from that data line DL and overlap that data line DL differs from the number of other lines that are in a different layer from the data line DL' and overlap the other data line DL' in a plan view. As a result, the parasitic capacitance existing in one data line DL differs from the parasitic capacitance existing in the other data line DL'. Therefore, even when the same data signal is applied to the two data lines DL and DL', a defect, such as difference in luminance of pixels that the two data lines DL and DL' pass by, may occur.

However, the display apparatus according to the present embodiment includes, as described above, the $1\text{-}1^{st}$ lower load LL1-1, the $1\text{-}2^{nd}$ lower load LL1-2, and the $1\text{-}1^{st}$ upper load UL1-1, and a $1\text{-}2^{nd}$ upper load UL1-2. When viewed from a direction perpendicular to the substrate 100 (z-axis direction, that is a plan view), the $1\text{-}1^{st}$ upper load UL1-1 overlaps the $1\text{-}1^{st}$ lower load LL1-1, and the $1\text{-}2^{nd}$ upper load UL1-2 overlaps the $1\text{-}2^{nd}$ lower load LL1-2 in a plan view. Accordingly, a $1\text{-}1^{st}$ capacitance is formed between the 1-1st lower load LL1-1 and the 1-1st upper load UL1-1, and also, a 1-2nd capacitance is formed between the $1\text{-}2^{nd}$ lower load LL1-2 and the $1\text{-}2^{nd}$ upper load UL1-2. Accordingly, the first data line DL1 electrically connected to the $1\text{-}1^{st}$ lower load LL1-1 is also affected by the $1\text{-}1^{st}$ capacitance and $1\text{-}2^{nd}$ capacitance, in addition to parasitic capacitance formed between other lines located on different layers from the first data line DL1. Thus, the total capacitance affecting the first data line DL1 may be set to be equal to or similar to the parasitic capacitance of the data line DL that is longer than the first data line DL1. Accordingly, a display apparatus that displays a high-quality image may be implemented by reducing the difference in luminance of pixels.

The $1\text{-}1^{st}$ lower load LL1-1 and the $1\text{-}2^{nd}$ lower load LL1-2 electrically connected to the first data line DL1 are apart from each other and also electrically connected to each other. Alternatively, the $1\text{-}1^{st}$ lower load LL1-1 and the $1\text{-}2^{nd}$ lower load LL1-2 may be integrally formed as a single body. However, in that case, there is a problem that defects may occur during a manufacturing process. Charges may be accumulated in a conductive layer during the manufacturing process, and when an area of the conductive layer is relatively large, the amount of accumulated charges may be greatly increased. When the $1\text{-}1^{st}$ lower load LL1-1 and the $1\text{-}2^{nd}$ lower load LL1-2 are integrally formed as a single body, a large amount of charges may be accumulated in the conductive layer. As a result, the large amount of static electricity may affect wires or conductive layers located adjacent to the conductive layer, causing problems such as a short circuit between the wires or the conductive layers.

However, in the display apparatus according to the present embodiment, the $1\text{-}1^{st}$ lower load LL1-1 and the $1\text{-}2^{nd}$ lower load LL1-2 are apart from each other. Thus, even when charges are accumulated in the $1\text{-}1^{st}$ lower load LL1-1 and the $1\text{-}2^{nd}$ lower load LL1-2 during a manufacturing process, an amount of charges accumulated in the $1\text{-}1^{st}$ lower load LL1-1 and the $1\text{-}2^{nd}$ lower load LL1-2 may be controlled to be not large. Accordingly, in the manufacturing process, defects due to static electricity in wires or conductive layers located adjacent to the $1\text{-}1^{st}$ lower load LL1-1 and the $1\text{-}2^{nd}$ lower load LL1-2 may be effectively prevented or minimized.

After forming the 1-1st lower load LL1-1 and the $1\text{-}2^{nd}$ lower load LL1-2 in the manufacturing process, the $1\text{-}1^{st}$ lower load LL1-1 and the $1\text{-}2^{nd}$ lower loads LL1-2 are electrically connected to each other. However, in the manufacturing process, defects due to static electricity may be effectively prevented or minimized until electrically connecting the $1\text{-}1^{st}$ lower load LL1-1 and the $1\text{-}2^{nd}$ lower load LL1-2 to each other in the manufacturing process.

Hereinafter, a structure in the display area DA, an electrical connection structure of the $1\text{-}1^{st}$ lower load LL1-1 and the $1\text{-}2^{nd}$ lower load LL1-2, and an electrical connection structure of the $1\text{-}1^{st}$ upper load UL1-1 and the $1\text{-}2^{nd}$ upper loads UL1-2 will be described with reference to FIG. 5.

As described above, various components may be disposed on the substrate 100 as described above. A buffer layer 111 may be arranged on the substrate 100. The buffer layer 111 may reduce or block penetration of foreign substances, moisture, or external air from below the substrate 100. The buffer layer 111 may include an inorganic insulating material such as silicon oxide, silicon oxynitride, or silicon nitride, and may have a single layer or a multi-layer structure including the above-described material.

The organic light-emitting diode OLED may be electrically connected to a corresponding pixel circuit PC as described above with reference to FIG. 2. The pixel circuit PC may include the first through seventh thin-film transistors T1 through T7 and the storage capacitor Cst. In a region corresponding to IV-IV' of FIG. 5, the driving thin-film transistor T1 and the storage capacitor Cst of the pixel circuit PC are illustrated, and also, a structure in which the organic light-emitting diode OLED is connected to a portion of the emission control thin-film transistor T6 or the second initialization thin-film transistor T7 is illustrated. However, region IV-IV' of FIG. 5 illustrates an exemplary cross-section, and the arrangement order or connection relationship of the components shown in region IV-IV' may be variously changed.

A semiconductor layer 1100 included in the driving thin-film transistor T1 may be connected to a semiconductor layer 1100 included in the emission control thin-film transistor T6 or the second initialization thin-film transistor T7 in a plan view. The semiconductor layers 1100 may be connected to each other because, as described above with reference to FIG. 2, the driving drain region D1 of the driving thin-film transistor T1 is electrically connected to the emission control source region S6 of the emission control thin-film transistor T6, and the emission control drain region D6 of the emission control thin-film transistor T6 is electrically connected to the second initialization source region S7 of the second initialization thin-film transistor T7. However, the cross-section of region IV-IV' in FIG. 5 is a cross-section taken along a line having a shape bent a plurality of times when viewed from a direction perpendicular to the substrate 100 (z-axis direction, that is a plan view), and thus, the semiconductor layer 1100 included in the driving thin-film transistor T1 is illustrated to be apart from the semiconductor layer 1100 included in the emission control thin-film transistor T6 or the second initialization thin-film transistor T7.

The driving thin-film transistor T1 may include a channel region corresponding to a portion of the semiconductor layer 1100, the driving gate electrode G1 overlapping the channel region of the semiconductor layer 1100, and a source electrode and a drain electrode connected to the driving source region S1 and the driving drain region D1 of the semiconductor layer 1100, respectively. The driving gate electrode G1 may function as the lower electrode CE1 of the storage capacitor Cst. The upper electrode CE2 of the storage capacitor Cst is disposed above the driving gate electrode G1. A gate insulating layer 113 may be between the semiconductor layer 1100 and the driving gate electrode G1, and a first interlayer-insulating layer 115 may be between the driving gate electrode G1 and the upper electrode CE2 of the storage capacitor Cst, and a second interlayer-insulating layer 117 may be between the upper electrode CE2 of the storage capacitor Cst and the source and drain electrodes.

When the driving drain region D1 of the driving thin-film transistor T1 is integrally formed as a single body with the emission control source region S6 of the emission control thin-film transistor T6, the driving thin-film transistor T1 may not have a drain electrode, and when the driving source region S1 of the driving thin-film transistor T1 is integrally formed as a single body with the switching drain region D2 of the switching thin-film transistor T2, the driving thin-film transistor T1 may not have a source electrode.

The semiconductor layer 1100 may include polysilicon. In an embodiment, the semiconductor layer 1100 may include amorphous silicon. Alternatively, the semiconductor layer 1100 may include an oxide semiconductor of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer 1100 may include the channel region and a source region and a drain region that are doped with impurities.

The gate insulating layer 113 may include an inorganic insulating material such as silicon oxide, silicon oxynitride, or silicon nitride, and may have a single layer or a multi-layer structure including the above-described material.

The driving gate electrode G1 or the lower electrode CE1 may include a low-resistance conductive material such as molybdenum (Mo), aluminum (Al), copper (Cu), and/or titanium (Ti) and may have a single-layer or multi-layer structure including the above material. For example, the driving gate electrode G1 may have a three-layer structure of a molybdenum layer/aluminum layer/molybdenum layer.

The first interlayer-insulating layer 115 may include an inorganic insulating material such as silicon oxide, silicon oxynitride, or silicon nitride, and may have a single layer or a multi-layer structure including the above-described material.

The upper electrode CE2 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multi-layer structure including the above-described material.

The second interlayer-insulating layer 117 may include an inorganic insulating material such as silicon oxide, silicon oxynitride, or silicon nitride, and may have a single layer or a multi-layer structure including the above-described material.

The source electrode and/or the drain electrode disposed on the second interlayer-insulating layer 117 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multi-layer structure including the above-described material. For example, the source electrode and/or the drain electrode may have a three-layer structure including a titanium layer/aluminum layer/titanium layer. A first connection electrode 1670 may also be disposed on the second interlayer-insulating layer 117, and the first connection electrode 1670 may be connected to the semiconductor layer 1100 therebelow through a contact hole.

A third interlayer-insulating layer 119 may be disposed on the driving thin-film transistor T1. The third interlayer-insulating layer 119 may include an inorganic insulating material such as silicon oxide, silicon oxynitride, or silicon nitride, and may have a single layer or a multi-layer structure including the above-described material.

A wire or a connection electrode or the like may be disposed on the third interlayer-insulating layer 119. FIG. 5 illustrates the first data line DL1, the first power line PL1, and/or a second connection electrode 1740 located in region IV-IV' on the third interlayer-insulating layer 119, which may be referred to as a second insulating layer. The second connection electrode 1740 may be connected to the first connection electrode 1670 therebelow through a contact hole. The first data line DL1, the first power line PL1, the scan line SL, and the second connection electrode 1740 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multi-layer structure including the above-described material. For example, the first data line DL1, the first power line PL1, the scan line SL and/or the second connection electrode 1740 may have a three-layer structure of a titanium layer/aluminum layer/titanium layer.

A planarization layer 123 may be disposed on the first data line DL1, the first power line PL1, the scan line SL, and/or the second connection electrode 1740. The planarization layer 123 may include an organic insulating material such as acrylic, benzocyclobutene ("BCB"), polyimide, or hexamethyldisiloxane ("HMDSO").

The organic light-emitting diode OLED may be disposed on the planarization layer 123. The organic light-emitting diode OLED may include a stacked structure including a pixel electrode 210, an emission layer 220, and an opposite electrode 230. The stacked structure may include a first functional layer (not shown) between the pixel electrode 210 and the emission layer 220 or a second functional layer (not shown) between the emission layer 220 and the opposite electrode 230.

The pixel electrode 210 is disposed on the planarization layer 123, and may be connected to the second connection electrode 1740 or the like therebelow through a contact hole defined in the planarization layer 123. The pixel electrode 210 may include a reflective layer and/or a transparent conductive layer. The reflective layer may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The transparent conductive layer may include indium tin oxide ("ITO"), indium zinc oxide ("IZO"), zinc oxide (ZnO), indium oxide ($In_2O_3$), indium gallium oxide ("IGO") or aluminum zinc oxide ("AZO"). For example, the pixel electrode 210 may have a three-layered structure of an ITO layer/an Ag layer/an ITO layer.

A pixel defining layer 125 may cover edges of the pixel electrode 210 and include an opening overlapping the pixel electrode 210 in a plan view. The pixel defining layer 125 may increase a distance between the edges of the pixel electrode 210 and the opposite electrode 230 above the pixel electrode 210 to thereby prevent an arc or the like at the edges of the pixel electrode 210. As described above, the pixel defining layer 125 may also have a function of defining pixels. For example, portions indicated by the first pixel P1 and a second pixel P2 in FIGS. 3 and 4 may be understood to approximately correspond to the pixel electrode 210 or the opening of the pixel defining layer 125.

The pixel defining layer 125 may include an organic insulating material such as acryl, BCB, polyimide, polyamide, phenol, or HMDSO. The pixel defining layer 125 may include a photosensitive material. When necessary, the pixel defining layer 125 may include a black dye/pigment. For example, the pixel defining layer 125 may include a cardo-based binder resin and a pigment. Here, a mixture of a lactam black pigment and a blue pigment may be used as the pigment. Alternatively, the pixel defining layer 125 may include carbon black.

The emission layer 220 may be located to correspond to the opening of the pixel defining layer 125 and may overlap the pixel electrodes 210 in a plan view. The emission layer 220 may include a polymer organic material or a low molecular weight organic material that emits light of a certain color. A first functional layer and a second functional layer may be below and above the emission layer 220.

The first functional layer may include a hole transport layer ("HTL") and/or a hole injection layer ("HIL"). The second functional layer may include an electron transport layer ("ETL") and/or an electron injection layer ("EIL"). Unlike the emission layer 220, the first functional layer and/or the second functional layer may be entirely disposed on the substrate 100. In other words, the first functional layer and/or the second functional layer may cover the display area DA. For example, the first functional layer and/or the second functional layer may be integrally formed as a single body in the display area DA.

The opposite electrode 230 may include a transmissive electrode, a semi-transmissive electrode or a reflective electrode. The opposite electrode 230 may include a metal thin film having a relatively small work function including Li, Ca, LiF/Ca, LiF/Al, Al, Ag, Mg, and a compound thereof. Also, the opposite electrode 230 may include a transparent conductive oxide ("TCO") layer such as ITO, IZO, ZnO or $In_2O_3$ disposed on the metal thin-film. The opposite electrode 230 may be integrally formed as a single body on the entire surface of the display area DA to be arranged above the emission layer 220 and the pixel defining layer 125.

An encapsulation layer (not shown) may be disposed on the organic light-emitting diode OLED. The encapsulation layer may include a first inorganic encapsulation layer, a second inorganic encapsulation layer, and an organic encapsulation layer therebetween.

Each of the first inorganic encapsulation layer and the second inorganic encapsulation layer may include one or more inorganic insulating materials. The inorganic insulating material may include aluminum oxide, titanium oxide, tantalum oxide, hafnium oxide, zinc oxide, silicon oxide, silicon nitride and/or silicon oxynitride.

The organic encapsulation layer may include a polymer-based material. Examples of the polymer-based material may include an acrylic resin, an epoxy resin, polyimide, polyethylene, and the like. For example, the organic encapsulation layer may include an acrylic resin, such as polymethylmethacrylate, polyacrylic acid, and the like. The organic encapsulation layer may be formed by hardening a monomer or applying a polymer.

The $1-1^{st}$ lower load LL1-1 and the $1-2^{nd}$ lower load LL1-2 illustrated in regions II-II' and III-III' of FIG. 5 may be disposed on the same layer as the driving gate electrode G1. That is, the $1-1^{st}$ lower load LL1-1 and the $1-2^{nd}$ lower load LL1-2 may be on the gate insulating layer 113, like the driving gate electrode G1. During a manufacturing process, the $1-1^{st}$ lower load LL1-1 and the $1-2^{nd}$ lower load LL1-2 may be simultaneously formed of the same material as that of the driving gate electrode G1. Accordingly, the $1-1^{st}$ lower load LL1-1, the $1-2^{nd}$ lower load LL1-2, and the driving gate electrode G1 may include the same material and have the same layer structure as each other.

The $1-1^{st}$ upper load UL1-1 and the $1-2^{nd}$ upper load UL1-2 illustrated in regions I-I', II-II', and III-III' of FIG. 5 may be disposed on the same layer as the upper electrode CE2 of the storage capacitor Cst. That is, the $1-1^{st}$ upper load UL1-1 and the $1-2^{nd}$ upper load UL1-2 may also be disposed on the first interlayer-insulating layer 115, like the upper electrode CE2 of the storage capacitor Cst. During a manufacturing process, the $1-1^{st}$ upper load UL1-1 and the $1-2^{nd}$ upper load UL1-2 may be simultaneously formed of the same material as the material of the upper electrode CE2 of the storage capacitor Cst. Accordingly, the $1-1^{st}$ upper load UL1-1, the $1-2^{nd}$ upper load UL1-2, and the upper electrode CE2 of the storage capacitor Cst may include the same material and have the same layer structure as each other. The upper electrode CE2 may be referred as "capacitor electrode".

As described above, the 1-1st lower load LL1-1 and the $1-2^{nd}$ lower load LL1-2 that are apart from each other are electrically connected to each other, and thus, they may be electrically connected to each other via a lower load connection layer LLCL. The lower load connection layer LLCL may be disposed on the second interlayer-insulating layer 117 which may be referred to as a first insulating layer covering the $1-1^{st}$ upper load UL1-1 and the $1-2^{nd}$ upper load UL1-2. That is, the lower load connection layer LLCL may be disposed on the same layer as the source electrode, the drain electrode, and/or the first connection electrode 1670. The lower load connection layer LLCL may be connected to each of the $1-1^{st}$ lower load LL1-1 and the $1-2^{nd}$ lower load LL1-2 through contact holes defined in an insulating layer thereunder, thereby electrically connecting the $1-1^{st}$ lower load LL1-1 to the $1-2^{nd}$ lower load LL1-2 to each other. In a manufacturing process, as the $1-1^{st}$ lower load LL1-1 and the $1-2^{nd}$ lower load LL1-2 are not electrically connected to each other until the lower load connection layer LLCL is formed, defects such as a short circuit in peripheral wires due to charges accumulated in the $1-1^{st}$ lower load LL1-1 and the $1-2^{nd}$ lower load LL1-2 may be prevented.

In a manufacturing process, the lower load connection layer LLCL may be formed using the same material as that of the source electrode, the drain electrode, and/or the first connection electrode 1670. Accordingly, the lower load connection layer LLCL, the source electrode, the drain electrode, and/or the first connection electrode 1670 may include the same material and the same layer structure as each other.

As the $1-1^{st}$ upper load UL1-1 and the $1-2^{nd}$ upper load UL1-2 that are apart from each other are electrically connected to each other, as illustrated in region I-I' of FIG. 5, they may be electrically connected to each other via an upper load connection layer ULCL. The upper load connection layer ULCL may be disposed on the second interlayer-insulating layer 117 which may be referred to as the first insulating layer covering the $1-1^{st}$ upper load UL1-1 and the $1-2^{nd}$ upper load UL1-2. That is, the upper load connection layer ULCL may be disposed on the same layer as the source electrode, the drain electrode, and/or the first connection electrode 1670. The upper load connection layer ULCL may be connected to each of the 1-1$^{st}$ upper load UL1-1 and the 1-2$^{nd}$ upper load UL1-2 through contact holes defined in an insulating layer therebelow, thereby electrically connecting the 1-1$^{st}$ upper load UL1-1 to the 1-2$^{nd}$ upper load UL1-2. In a manufacturing process, the upper load connection layer ULCL may be formed using the same material as the material of the source electrode, the drain electrode, and/or the first connection electrode 1670. Accordingly, the upper load connection layer ULCL, the lower load connection layer LLCL, the source electrode, the drain electrode, and/or the first connection electrode 1670 may include the same material and the same layer structure as each other.

The first data line DL1 may be electrically connected to the 1-1$^{st}$ lower load LL1-1 as described above. In region III-III' of FIG. 5, a connection structure of the first data line DL1 and the 1-1$^{st}$ lower load LL1-1 is illustrated. As illustrated in FIG. 5, a data connection layer DCL is disposed on the second interlayer-insulating layer 117 above the 1-1$^{st}$ lower load LL1-1. The data connection layer DCL is connected to the 1-1$^{st}$ lower load LL1-1 via a contact hole defined in an insulating layer therebelow. Like the upper load connection layer ULCL and the lower load connection layer LLCL, the data connection layer DCL is on the second interlayer-insulating layer 117, and thus, the data connection layer DCL may be formed using the same material as the material of the upper load connection layer ULCL and the lower load connection layer LLCL and simultaneously therewith. Accordingly, the data connection layer DCL, the upper load connection layer ULCL, the lower load connection layer LLCL, the source electrode, the drain electrode, and/or the first connection electrode 1670 may include the same material and the same layer structure as each other.

The first data line DL1 is disposed on the third interlayer-insulating layer 119, which may be referred to as a second insulating layer and covers the data connection layer DCL, the upper load connection layer ULCL, the lower load connection layer LLCL, the source electrode, the drain electrode, and/or the first connection electrode 1670. The first data line DL1 is connected to the data connection layer DCL via a contact hole defined in an insulating layer therebelow. Accordingly, the first data line DL1 is electrically connected to the 1-1$^{st}$ lower load LL1-1 via the data connection layer DCL.

Moreover, the first power line PL1 may be electrically connected to the 1-1$^{st}$ upper load UL1-1. A connection structure of the first power line PL1 and the 1-1$^{st}$ upper load UL1-1 may be similar to that of the first data line DL1 and the 1-1$^{st}$ lower load LL1-1. That is, a power connection layer (not shown) similar to the data connection layer DCL may be disposed on the second interlayer-insulating layer 117 covering the 1-1$^{st}$ upper load UL1-1. The power connection layer is connected to the 1-1$^{st}$ upper load UL1-1 via a contact hole defined in an insulating layer therebelow. Like the data connection layer DCL, the upper load connection layer ULCL, and the lower load connection layer LLCL, the power connection layer is also disposed on the second interlayer-insulating layer 117, and thus, the power connection layer may be formed using the same material as that of the data connection layer DCL, the upper load connection layer ULCL and the lower load connection layer LLCL and simultaneously therewith in a manufacturing process. Accordingly, the power connection layer, the data connection layer DCL, the upper load connection layer ULCL, the lower load connection layer LLCL, the source electrode, the drain electrode, and/or the first connection electrode 1670 may include the same material and the same layer structure as each other.

The first power line PL1 is disposed on the third interlayer-insulating layer 119, which may be referred to as the second insulating layer and covers the power connection layer, the data connection layer DCL, the upper load connection layer ULCL, the lower load connection layer LLCL, the source electrode, the drain electrode, and/or the first connection electrode 1670. The first power line PL1 is connected to the power connection layer via a contact hole defined in an insulating layer therebelow. Accordingly, the first power line PL1 is electrically connected to the 1-1$^{st}$ upper load UL1-1 via the power connection layer.

For reference, as illustrated in region III-III' of FIGS. 4 and 5, the 1-1$^{st}$ lower load LL1-1 has a protrusion, and the protrusion is disposed below the first data line DL1. Also, the protrusion of the 1-1$^{st}$ lower load LL1-1 and the first data line DL1 are electrically connected to each other via the data connection layer DCL between the protrusion of the 1-1$^{st}$ lower load LL1-1 and the first data line DL1. The 1-1$^{st}$ upper load UL1-1 also has a protrusion, and the protrusion is disposed below the first power line PL1. Also, the protrusion of the 1-1$^{st}$ upper load UL1-1 and the first power line PL1 are electrically connected to each other via the power connection layer between the protrusion of the 1-1$^{st}$ upper load UL1-1 and the first power line PL1.

In a connection structure of the 1-1$^{st}$ lower load LL1-1 and the 1-2$^{nd}$ lower load LL1-2, also, as illustrated in region II-II' of FIGS. 4 and 5, the 1-1$^{st}$ lower load LL1-1 has a protrusion protruding toward the 1-2$^{nd}$ lower load LL1-2, and the 1-2$^{nd}$ lower load LL1-2 also has a protrusion protruding toward the 1-1$^{st}$ lower load LL1-1. The lower load connection layer LLCL may contact the protrusion of the 1-1$^{st}$ lower load LL1-1 and the protrusion of the 1-2$^{nd}$ lower load LL1-2 to electrically connect the 1-1$^{st}$ lower load LL1-1 to the 1-2$^{nd}$ lower load LL1-2.

In a connection structure of the 1-1$^{st}$ upper load UL1-1 and the 1-2$^{nd}$ upper load UL1-2, also, as illustrated in region I-I' of FIGS. 4 and 5, the 1-1$^{st}$ upper load UL1-1 has a protrusion protruding toward the 1-2$^{nd}$ upper load UL1-2, and the 1-2$^{nd}$ upper load UL1-2 also has a protrusion protruding toward the 1-1$^{st}$ upper load UL1-1. The upper load connection layer ULCL may contact the protrusion of the 1-1$^{st}$ upper load UL1-1 and the protrusion of the 1-2$^{nd}$ upper load UL1-2 to electrically connect the 1-1$^{st}$ upper load UL1-1 to the 1-2$^{nd}$ upper load UL1-2.

Hereinafter, other components of the display apparatus according to the present embodiment will be described with reference to FIGS. 3 and 4. As illustrated in FIGS. 3 and 4, the display apparatus according to the present embodiment may include, for example, a second data line DL2 and a second power line PL2.

The second data line DL2 extends from the display area DA into the peripheral area PA. The second data line DL2 extends approximately in the first direction (+y direction) in the display area DA and passes by a plurality of pixels. In FIGS. 3 and 4, the second data line DL2 is illustrated as passing by the second pixel P2. The second data line DL2 is electrically connected to a 2-1$^{st}$ lower load LL2-1 located in the peripheral area PA. In detail, like the first data line DL1, the second data line DL2 is disposed on the third interlayer-insulating layer 119, and the second data line DL2 may be connected to the 2-1$^{st}$ lower load LL2-1 via a contact hole defined in an insulating layer therebelow. The 2-1$^{st}$ lower load LL2-1 may also be disposed on the gate insulating layer 113, like the 1-1$^{st}$ lower load LL1-1. A connection structure of the second data line DL2 and the 2-1$^{st}$ lower load LL2-1 is identical to that of the first data line DL1 and the 1-1$^{st}$ lower load LL1-1.

As illustrated in FIG. 3, a 2-2$^{nd}$ lower load LL2-2 is also located in the peripheral area PA, in addition to the 2-1$^{st}$ lower load LL2-1. The 2-2$^{nd}$ lower load LL2-2 is located in the first direction (+y direction) from the 2-1$^{st}$ lower load LL2-1. That is, when viewed from a direction perpendicular to the substrate 100 (z-axis direction, that is a plan view), a central axis passing through a center of the 2-1$^{st}$ lower load LL2-1 in the first direction and a central axis passing through a center of the 2-2$^{nd}$ lower load LL2-2 in the first direction are located on the same imaginary straight line. This imaginary straight line is parallel to the first direction in which the second data line DL2 extends in the display area DA. The 2-2$^{nd}$ lower load LL2-2 is electrically connected to the 2-1$^{st}$ lower load LL2-1. A connection structure of the 2-1$^{st}$ lower load LL2-1 and the 2-2$^{nd}$ lower load LL2-2 is identical to that of the 1-1$^{st}$ lower load LL1-1 and the 1-2$^{nd}$ lower load LL1-2.

As illustrated in FIGS. 3 and 4, the second power line PL2 extends from the display area DA into the peripheral area PA. The second power line PL2 extends approximately in the first direction (+y direction) in the display area DA and passes by a plurality of pixels. In FIGS. 3 and 4, the second power line PL2 is illustrated as passing by the second pixel P2. That is, the second power line PL2 may be approximately parallel to the second data line DL2 in the display area DA.

The second power line PL2 is electrically connected to a 2-1$^{st}$ upper load UL2-1 located in the peripheral area PA. In detail, like the first power line PL1, the second power line PL2 is disposed on the third interlayer-insulating layer 119, and the second power line PL2 may be connected to the 2-1$^{st}$ upper load UL2-1 via a contact hole defined in an insulating layer therebelow. The 2-1$^{st}$ upper load UL2-1 may also be disposed on the first interlayer-insulating layer 115, like the 1-1$^{st}$ upper load UL1-1.

In the peripheral area PA, in addition to the 2-1$^{st}$ upper load UL2-1, the 2-2$^{nd}$ upper load UL2-2 is also located, as illustrated in FIG. 3. The 2-2$^{nd}$ upper load UL2-2 is located in the first direction (+y direction) from the 2-1$^{st}$ upper load UL2-1. That is, when viewed from a direction perpendicular to the substrate 100 (z-axis direction, that is a plan view), a central axis passing through a center of the 2-1$^{st}$ upper load UL2-1 and a central axis passing through a center of the 2-2$^{nd}$ upper load UL2-2 are located on the same imaginary straight line. This imaginary straight line is parallel to the first direction in which the first power line PL1 extends in the display area DA. The 2-2$^{nd}$ upper load UL2-2 is electrically connected to the 2-1$^{st}$ upper load UL2-1. A connection structure of the 2-1$^{st}$ upper load UL2-1 and the 2-2$^{nd}$ upper load UL2-2 is identical to that of the 1-1$^{st}$ upper load UL1-1 and the 1-2$^{nd}$ upper load UL1-2.

The 2-1st upper load UL2-1 is disposed above the 2-1st lower load LL2-1, and is electrically insulated from the 2-1$^{st}$ lower load LL2-1. The 2-2$^{nd}$ upper load UL2-2 electrically connected to the 2-1$^{st}$ upper load UL2-1 is also disposed above the 2-2$^{nd}$ lower load LL2-2, and is electrically insulated from the 2-2$^{nd}$ lower load LL2-2. Functions of the 2-1$^{st}$ lower load LL2-1, the 2-2$^{nd}$ lower load LL2-2, the 2-1$^{st}$ upper load UL2-1, and the 2-2$^{nd}$ upper load UL2-2 related to the second data line DL2 are as described above with respect to the functions of the 1-1$^{st}$ lower load LL1-1, the 1-2$^{nd}$ lower load LL1-2, the 1-1$^{st}$ upper load UL1-1, and the 1-2$^{nd}$ upper load UL1-2 related to the first data line DL1.

Meanwhile, as illustrated in FIGS. 1, 3, and 4, a distance from the first data line DL1 to a center of the display area DA is greater than a distance from the second data line DL2 to the center of the display area DA. Also, due to the approximately circular or elliptical shape of the display area DA, a length of the second data line DL2 is different from a length of the first data line DL1. Accordingly, the number of wires disposed in other layers overlapped by the second data line DL2 in the display area DA is different from the number of wires located in other layers overlapped by the first data line DL1 in the display area DA in a plan view, and a second parasitic capacitance of the second data line DL2 is different from a first parasitic capacitance of the first data line DL1.

Accordingly, a first capacitance between lower loads including the 1-1$^{st}$ lower load LL1-1 and the 1-2$^{nd}$ lower load LL1-2 electrically connected to the first data line DL1 and upper loads including the 1-1$^{st}$ upper load UL1-1 and the 1-2$^{nd}$ upper load UL1-2 may be different from a second capacitance between lower loads including the 2-1$^{st}$ lower load LL2-1 and the 2-2$^{nd}$ lower loads LL2-2 electrically connected to the second data line DL2 and upper loads including the 2-1$^{st}$ upper load UL2-1 and the 2-2$^{nd}$ upper load UL2-2. Accordingly, the total capacitance in consideration of the first parasitic capacitance and the first capacitance may be equal to or similar to the total capacitance in consideration of the second parasitic capacitance and the second capacitance. Accordingly, a display apparatus that displays a high-quality image may be implemented.

In detail, as the distance from the first data line DL1 to the center of the display area DA is greater than the distance from the second data line DL2 to the center of the display area DA, the number of wires that are disposed in other layers and overlap the second data line DL2 in the display area DA in a plan view is greater than the number of wires that are disposed in other layers and overlap the first data line DL1 in the display area DA. Accordingly, the second parasitic capacitance of the second data line DL2 is greater than the first parasitic capacitance of the first data line DL1.

Accordingly, the first capacitance between the lower loads including the 1-1$^{st}$ lower load LL1-1 and the 1-2$^{nd}$ lower load LL1-2 electrically connected to the first data line DL1 and the upper loads including the 1-1$^{st}$ upper load UL1-1 and the 1-2$^{nd}$ upper load UL1-2 may be greater than the second capacitance between the lower loads including the 2-1$^{st}$ lower load LL2-1 and the 2-2$^{nd}$ lower loads LL2-2 electrically connected to the second data line DL2 and the upper loads including the 2-1$^{st}$ upper load UL2-1 and the 2-2$^{nd}$ upper load UL2-2. Accordingly, the total capacitance in consideration of the first parasitic capacitance and the first capacitance may be equal to or similar to the total capacitance in consideration of the second parasitic capacitance and the second capacitance. Accordingly, a display apparatus that displays a high-quality image may be implemented.

Meanwhile, as described above with reference to FIG. 1, the scan line SL and the emission control line EL are located in the display area DA. The scan line SL and the emission control line EL extend in a second direction (+x direction) crossing the first direction (+y direction) in which the data lines DL and DL' and the power lines PL and PL' extend in the display area DA.

As illustrated in FIGS. 3 and 4, the scan line SL is electrically connected to the scan driving circuit 30 via a first scan connection line SCL1 and a second scan connection line SCL2. The first scan connection line SCL1 is disposed on the third interlayer-insulating layer 119 which is the second insulating layer covering the lower load connection layer LLCL and the upper load connection layer ULCL, and extends from the scan driving circuit 30 located in the peripheral area PA to cross over the lower load connection layer LLCL and the upper load connection layer ULCL. In regions I-I' and II-II' of FIG. 5, a portion of the first scan connection line SCL1 is illustrated. The first scan connection line SCL1 may be formed using the same material as the material of the first data line DL1 and the first power line PL1 and simultaneously therewith. That is, the first scan connection line SCL1, the first data line DL1, and the first power line PL1 may have the same layer structure and may include the same material as each other.

As illustrated in FIG. 4, the second scan connection line SCL2 is disposed on the second interlayer-insulating layer 117, which is the first insulating layer, and has one end electrically connected to the first scan connection line SCL1 thereabove through a contact hole defined in the third interlayer-insulating layer 119 thereabove. The second scan connection line SCL2 may be formed using the same material as the lower load connection layer LLCL and the upper load connection layer ULCL and simultaneously therewith. That is, the second scan connection line SCL2, the lower load connection layer LLCL, and the upper load connection layer ULCL may have the same layer structure and may include the same material as each other.

The other end of the second scan connection line SCL2 is connected to the scan line SL through a contact hole defined in the first interlayer-insulating layer 115 and the second interlayer-insulating layer 117 therebelow. For reference, the scan line SL may be on the gate insulating layer 113, like the driving gate electrode G1. That is, the scan line SL and the driving gate electrode G1 may be simultaneously formed using the same material as each other. Accordingly, the scan line SL and the driving gate electrode G1 may have the same layer structure and may include the same material as each other. Furthermore, the scan line SL may be integrally formed as a single body with the switching gate electrode G2 of the switching thin-film transistor T2.

Meanwhile, as illustrated in FIGS. 3 and 4, the emission control line EL is electrically connected to the emission control driving circuit through a first emission connection line ECL1 and a second emission connection line ECL2. The emission control driving circuit may be included in the scan driving circuit 30 as illustrated in FIG. 3. The present disclosure is not limited thereto, and the emission control driving circuit may exist separately from the scan driving circuit 30 in the peripheral area PA. For convenience, the emission control driving circuit included in the scan driving circuit 30 is described below.

The first emission connection line ECL1 is disposed on the third interlayer-insulating layer 119 which is the second insulating layer covering the lower load connection layer LLCL and the upper load connection layer ULCL, and extends from the scan driving circuit 30 located in the peripheral area PA to cross over the lower load connection layer LLCL and the upper load connection layer ULCL. The first emission connection line ECL1 may be formed using the same material as the material of the first data line DL1 and the first power line PL1 and simultaneously therewith. That is, the first emission connection line ECL1, the first scan connection line SCL1, the first data line DL1, and the first power line PL1 may have the same layer structure and may include the same material as each other.

As illustrated in FIG. 4, the second emission connection line ECL2 is disposed on the second interlayer-insulating layer 117, which is the first insulating layer, and has one end electrically connected to the first emission connection line ECL1 thereabove through a contact hole defined in the third interlayer-insulating layer 119 thereabove. The second emission connection line ECL2 may be formed using the same material as and simultaneously with the second scan connection line SCL2, the lower load connection layer LLCL, and the upper load connection layer ULCL. That is, the second emission connection line ECL2, the second scan connection line SCL2, the lower load connection layer LLCL, and the upper load connection layer ULCL may have the same layer structure and may include the same material as each other.

The other end of the second emission connection line ECL2 is connected to the emission control line EL through a contact hole defined in the second interlayer-insulating layer 117 therebelow. For reference, like the upper electrode CE2 of the storage capacitor Cst, the $1\text{-}1^{st}$ upper load UL1-1, and the $1\text{-}2^{nd}$ upper load UL1-2, the emission control line EL may be disposed on the first interlayer-insulating layer 115. That is, the emission control line EL, the upper electrode CE2 of the storage capacitor Cst, the $1\text{-}1^{st}$ upper load UL1-1, and the $1\text{-}2^{nd}$ upper load UL1-2 may be formed using the same material as each other and simultaneously therewith. Accordingly, the emission control line EL, the upper electrode CE2 of the storage capacitor Cst, the $1\text{-}1^{st}$ upper load UL1-1, and the $1\text{-}2^{nd}$ upper load UL1-2 may have the same layer structure and include the same material as each other.

Figure 6:
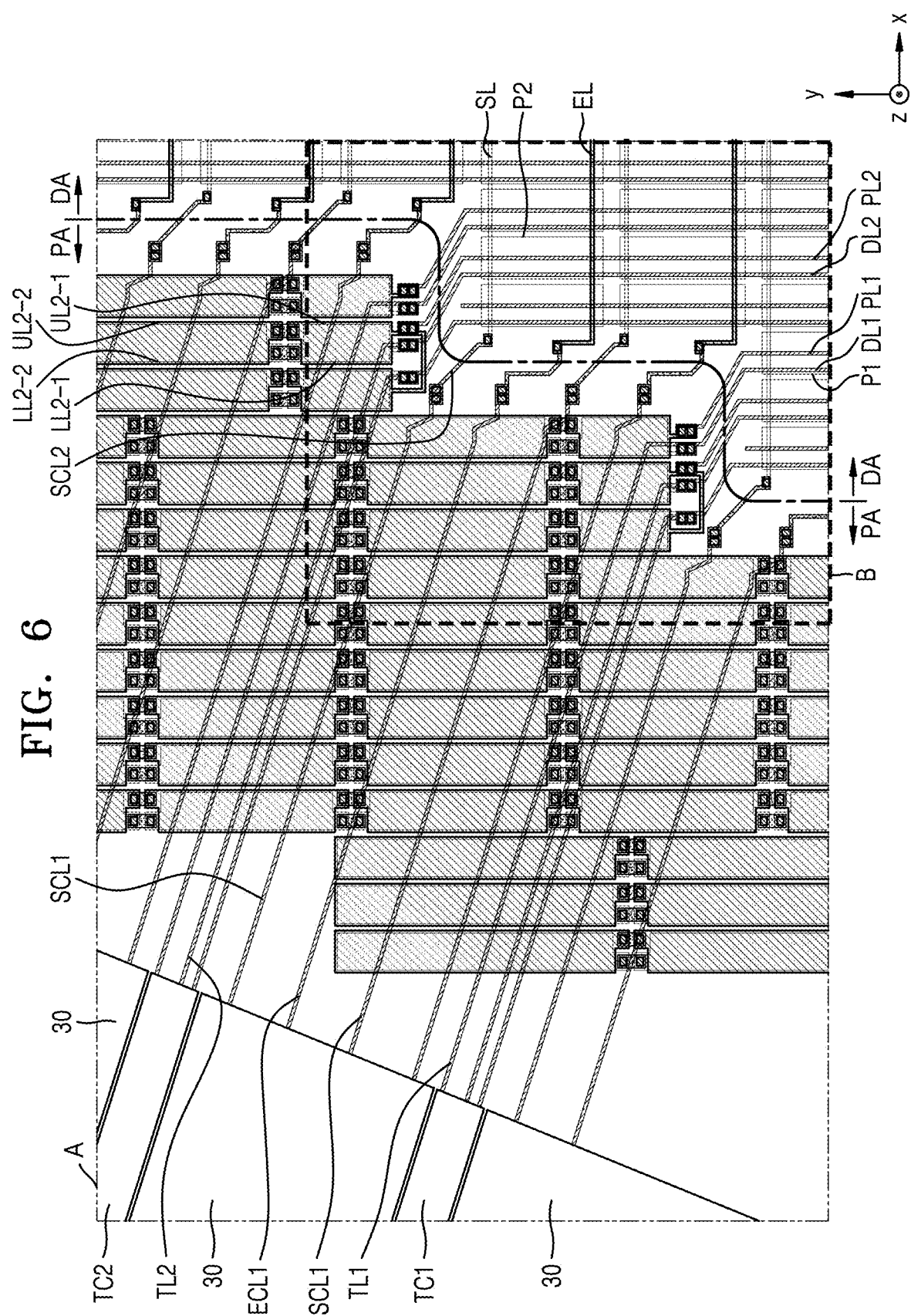
FIG. 6 is a conceptual diagram of an enlarged portion of a display apparatus according to another embodiment.
Figure 7:
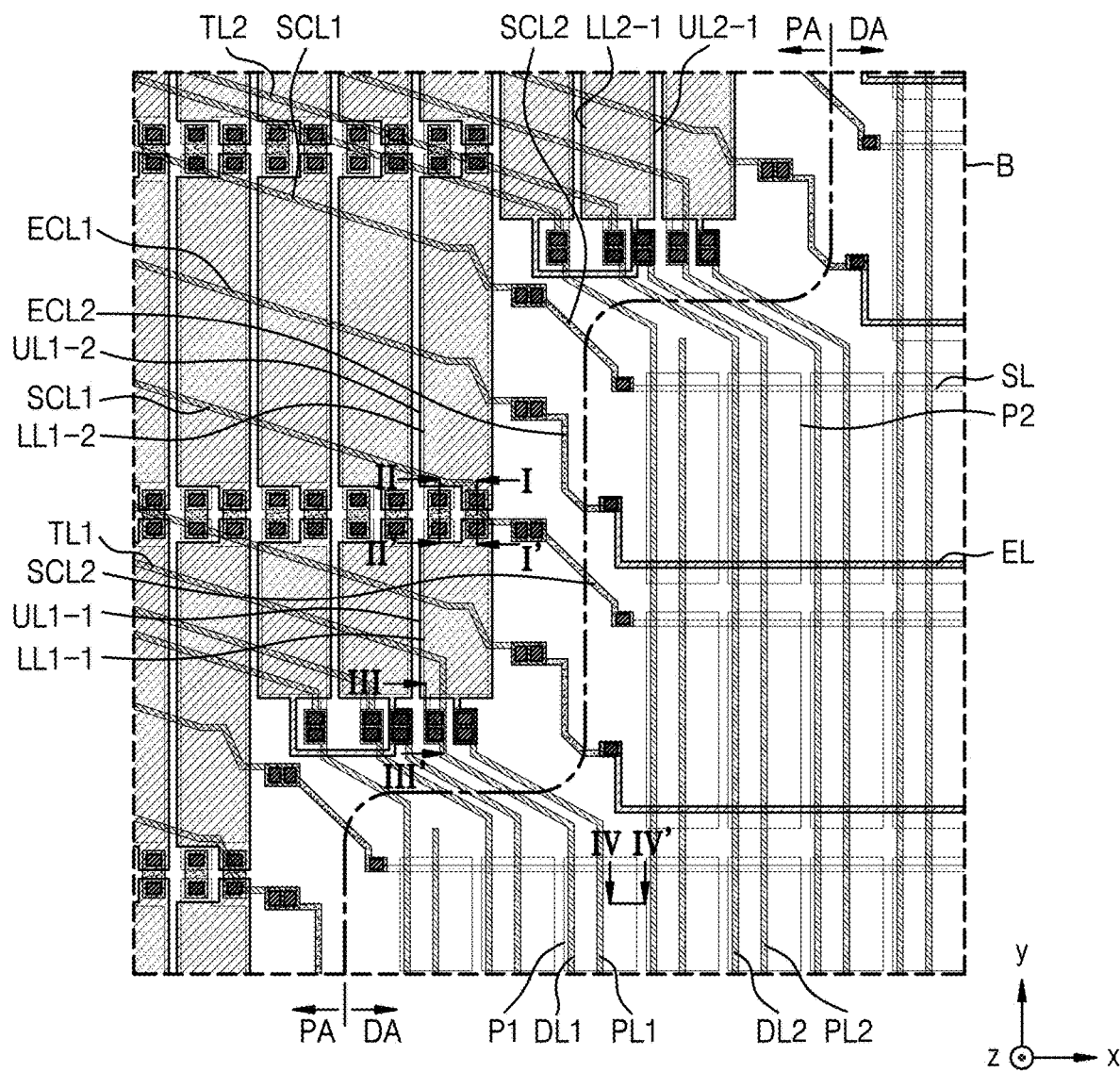
FIG. 7 is a conceptual diagram illustrating an enlarged region B of the display apparatus of FIG. 6.

FIG. 6 is a conceptual diagram of an enlarged portion of a display apparatus according to another embodiment. FIG. 7 is a conceptual diagram illustrating an enlarged region B of the display apparatus of FIG. 6.

The display apparatus according to the present embodiment is different from the display apparatus of the above-described embodiment described with reference to FIGS. 3 and 4 in that a first test line TL1 is further included in the peripheral area PA. The first test line TL1 may include a portion parallel to a portion of the first scan connection line SCL1. In FIGS. 6 and 7, the first test line TL1 and the first scan connection line SCL1 are illustrated to be approximately parallel.

An end of the first test line TL1 may be connected to the first data line DL1, and the other end of the first test line TL1 may be electrically connected to a first lighting test circuit TC1 in the peripheral area PA. That is, a side of the first test line TL1 may be connected to a portion of the first data line DL1, where the portion contacts the data connection layer DCL.

The first test line TL1 may be used in a manufacturing process; that is, the first test line TL1 may be configured to transfer, to the first data line DL1, a test signal from the first lighting test circuit TC1, where the test signal is used to inspect whether pixels including the first pixel P1, electrically connected to the first data line DL1, emit light normally. The first test line TL1 may be disposed on the third interlayer-insulating layer 119 like the first data line DL1, and may be integrally formed as a single body with the first data line DL1.

The display apparatus according to the present embodiment may further include a second test line TL2 in the peripheral area PA. The second test line TL2 may also include a portion parallel to a portion of the first scan connection line SCL1. In FIGS. 6 and 7, the second test line TL2 and the first scan connection line SCL1 are illustrated to be approximately parallel to each other.

An end of the second test line TL2 may be connected to the second data line DL2, and the other end of the second test line TL2 may be electrically connected to a second lighting test circuit TC2 in the peripheral area PA. That is, a side of the second test line TL2 may be connected to a portion of the second data line DL2, where the portion contacts the data connection layer DCL.

The second test line TL2 may be used in a manufacturing process that is, the second test line TL2 may be configured to transfer, to the second data line DL2, a test signal from the second lighting test circuit TC2, where the test signal is used to inspect whether pixels including the second pixel P2, electrically connected to the second data line DL2, emit light normally. The second test line TL2 may be disposed on the third interlayer-insulating layer 119 like the second data line DL2, and may be integrally formed as a single body with the second data line DL2. For reference, the second lighting test circuit TC2 may be electrically connected to the first lighting test circuit TC1.

As described above with reference to, for example, FIG. 5, the lower load connection layer LLCL electrically connects the $1-1^{st}$ lower load LL1-1 to the $1-2^{nd}$ lower load LL1-2, and the upper load connection layer ULCL electrically connects the $1-1^{st}$ upper load UL1-1 to the $1-2^{nd}$ upper load UL1-2. When viewed from a direction perpendicular to the substrate 100 (z-axis direction, that is a plan view), as illustrated in FIG. 7, the first scan connection line SCL1, the first test line TL1, and/or the second test line TL2 may overlap the lower load connection layer LLCL and/or the upper load connection layer ULCL. Thus, the first scan connection line SCL1, the first test line TL1, and/or the second test line TL2 are disposed more above than the lower load connection layer LLCL and the upper load connection layer ULCL. That is, the first scan connection line SCL1, the first test line TL1, and/or the second test line TL2 are inevitably disposed on the third interlayer-insulating layer 119, like the first data line DL1, the second data line DL2, the first power line PL1, and/or the second power line PL2.

According to an embodiment of the present disclosure as described above, a display apparatus, in a manufacturing process of which a defect ratio may be reduced, may be implemented. However, the scope of the present disclosure is not limited by the above-described effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising a display area and a peripheral area outside the display area;
a first data line extending from the display area into the peripheral area;
a $1-1^{st}$ lower load located in the peripheral area and electrically connected to the first data line;
a $1-2^{nd}$ lower load located in the peripheral area and electrically connected to the $1-1^{st}$ lower load;
a $1-1^{st}$ upper load located in the peripheral area and above the $1-1^{st}$ lower load, wherein the $1-1^{st}$ upper load is insulated from the $1-1^{st}$ lower load;
a $1-2^{nd}$ upper load located in the peripheral area and above the $1-2^{nd}$ lower load, wherein the $1-2^{nd}$ upper load is insulated from the $1-2^{nd}$ lower load and electrically connected to the $1-1^{st}$ upper load; and a lower load connection layer and an upper load connection layer, which are disposed on a first insulating layer covering the $1-1^{st}$ upper load and the $1-2^{nd}$ upper load,
wherein the lower load connection layer is disposed between and connected to the $1-1^{st}$ lower load and the $1-2^{nd}$ lower load via first contact holes and spaced apart from the first data line in a plan view, and
the upper load connection layer is disposed between and connected to the $1-1^{st}$ upper load and the $1-2^{nd}$ upper load via second contact holes.

2. The display apparatus of claim 1, wherein, when viewed from a direction perpendicular to the substrate, the $1-1^{st}$ upper load overlaps the $1-1^{st}$ lower load, and the $1-2^{nd}$ upper load overlaps the $1-2^{nd}$ lower load.

3. The display apparatus of claim 1, further comprising:
a second data line extending from the display area into the peripheral area;
a $2-1^{st}$ lower load located in the peripheral area and electrically connected to the second data line;
a $2-2^{nd}$ lower load located in the peripheral area and electrically connected to the $2-1^{st}$ lower load;
a $2-1^{st}$ upper load located in the peripheral area and above the $2-1^{st}$ lower load, wherein the $2-1^{st}$ upper load is insulated from the $2-1^{st}$ lower load; and
a $2-2^{nd}$ upper load located in the peripheral area and above the $2-2^{nd}$ lower load, wherein the $2-2^{nd}$ upper load is insulated from the $2-2^{nd}$ lower load and electrically connected to the $2-1^{st}$ upper load.

4. The display apparatus of claim 3, wherein a first capacitance between lower loads including the $1-1^{st}$ lower load and the $1-2^{nd}$ lower load and upper loads including the $1-1^{st}$ upper load and the $1-2^{nd}$ upper load is different from a second capacitance between lower loads including the $2-1^{st}$ lower load and the $2-2^{nd}$ lower loads and upper loads including the $2-1^{st}$ upper load and the $2-2^{nd}$ upper load.

5. The display apparatus of claim 3, wherein a distance from the first data line to a center of the display area is greater than a distance from the second data line to the center of the display area, and
a first capacitance between lower loads including the $1-1^{st}$ lower load and the $1-2^{nd}$ lower load and upper loads including the $1-1^{st}$ upper load and the $1-2^{nd}$ upper load is greater than a second capacitance between lower loads including the $2-1^{st}$ lower load and the $2-2^{nd}$ lower loads and upper loads including the $2-1^{st}$ upper load and the $2-2^{nd}$ upper load.

6. The display apparatus of claim 1, further comprising:
a thin-film transistor located in the display area and including a gate electrode,
wherein the $1-1^{st}$ lower load, the $1-2^{nd}$ lower load, and the gate electrode have a same layer structure as each other.

7. The display apparatus of claim 6, wherein the $1-1^{st}$ lower load, the $1-2^{nd}$ lower load, and the gate electrode are on a same layer as each other.

8. The display apparatus of claim 6, further comprising:
a capacitor electrode located in the display area and above the gate electrode,
wherein the $1-1^{st}$ upper load, the $1-2^{nd}$ upper load, and the capacitor electrode have a same layer structure as each other.

9. The display apparatus of claim 8, wherein the $1-1^{st}$ upper load, the $1-2^{nd}$ upper load, and the capacitor electrode are on a same layer as each other.

10. The display apparatus of claim 1, further comprising:
a first scan connection line which is disposed on a second insulating layer covering the lower load connection layer and the upper load connection layer, and extends from a scan driving circuit located in the peripheral area to cross over the lower load connection layer and the upper load connection layer;

a second scan connection line which is disposed on the first insulating layer, and has a first end electrically connected to the first scan connection line through a third contact hole defined in the second insulating layer; and a scan line disposed on a same layer as the gate electrode and electrically connected to a second end of the second scan connection line opposite the first end.

11. The display apparatus of claim 10, wherein the first data line is disposed on the second insulating layer.

12. The display apparatus of claim 10, further comprising:

a test line disposed on the second insulating layer in the peripheral area and including a portion parallel to a portion of the first scan connection line.

13. The display apparatus of claim 12, wherein the test line and the first data line are integrally formed as a single body.

14. The display apparatus of claim 12, wherein the test line is electrically connected to a lighting test circuit located in the peripheral area.

15. The display apparatus of claim 10, further comprising:

a power line disposed on the second insulating layer, extending from the display area into the peripheral area, and electrically connected to the $1\text{-}1^{st}$ upper load.

16. The display apparatus of claim 15, wherein the power line is parallel to the first data line in the display area.

17. The display apparatus of claim 1, further comprising:

a first emission connection line which is disposed on a second insulating layer covering the lower load connection layer and the upper load connection layer, and extends from a scan driving circuit located in the peripheral area to cross over the lower load connection layer and the upper load connection layer;

a second emission connection line which is disposed on the first insulating layer, and has a first end electrically connected to the first emission connection line through a fourth contact hole defined in the second insulating layer; and an emission control line extending into the display area and electrically connected to a second end of the second emission connection line opposite the first end.

18. The display apparatus of claim 17, wherein the emission control line, the $1\text{-}1^{st}$ upper load, and the $1\text{-}2^{nd}$ upper load are on a same layer as each other.

19. The display apparatus of claim 1, wherein, when viewed from a direction perpendicular to the substrate, a central axis passing through a center of the $1\text{-}1^{st}$ lower load and a central axis passing through a center of the $1\text{-}2^{nd}$ lower load are located on a same imaginary straight line, and a direction in which the first data line extends in the display area is parallel to the imaginary straight line.

20. The display apparatus of claim 1, wherein, when viewed from a direction perpendicular to the substrate, the display area has no pointed portions.

21. The display apparatus of claim 1, wherein, when viewed from a direction perpendicular to the substrate, the display area has a circular or elliptical shape.

* * * * *